METHOD FOR MANUFACTURING MULTI-LAYER FILM CIRCUITS

Filed Dec. 30, 1966 3 Sheets-Sheet 1

Nov. 17, 1970 J. P. PRITCHARD, JR., ET AL 3,540,954

METHOD FOR MANUFACTURING MULTI-LAYER FILM CIRCUITS

Filed Dec. 30, 1966 3 Sheets-Sheet 3

3,540,954

METHOD FOR MANUFACTURING MULTI-LAYER FILM CIRCUITS

John P. Pritchard, Jr., Richardson, Antoinette G. Queen, Dallas, and Joe T. Pierce and Buford G. Slay, Jr., Richardson, Tex., assignors to Texas Instruments Incorporated, Dallas, Tex., a corporation of Delaware Filed Dec. 30, 1966, Ser. No. 606,200
Int. Cl. C23f *1/00, 1/02*
U.S. Cl. 156—3 5 Claims

ABSTRACT OF THE DISCLOSURE

A multilayer cryogenic flip-flop circuit having tin gates formed between lead conductor strips and controlled by lead control conductors which are formed by coating a glass substrate with a lead ground plane which is covered by an insulating film. Over the insulating film is coated a tin film followed by a lead film and a film of a photo-resist material. The photo-resist material is exposed and developed to leave an area of the lead film exposed. The exposed area of the lead and the tin thereunder is etched with a nitric acid solution. The remainder of the photo-resist is removed and a new layer is applied, exposed and developed to permit etching of portions of the remaining lead by a water solution of acetic acid and hydrogen peroxide which removes the lead but does not remove the underlying tin, thus forming tin gates. The remaining photo-resist is removed, an insulating layer applied and a film of lead coated over the insulation. A layer of photo-resist is applied over the lead, exposed and developed to permit etching with a nitric acid solution. The remainder of the photo-resist is removed, leaving lead control conductors and ground leads.

FIELD OF THE INVENTION

This invention relates to adhesive bonding and miscellaneous chemical manufacture, and particularly methods of preferential etching of a plural layered base in the manufacture of multi-layered film circuits.

THE PRIOR ART

In the manufacture of multi-layer film circuits, it often becomes necessary to form "gated" current paths. Such "gated" current paths may often take the form of a first conductive metal interposed between and in electrical communication with paths of a second conductive metal.

For example, in U.S. Pat. 3,366,519 assigned to the assignee of the present invention, a process for manufacturing thin film circuits in general, and cryogenic circuits in particular, was described. In that process, a cryotron is fabricated by first forming a gate strip of one type of metal, such as tin, on a substrate. The gate strip is covered with a layer of photo-resist material through which windows are opened to expose the ends of the gate strip. A second metal film, such as lead, is then deposited over the photo-resist material so as to pass through the windows and make contact with the previously deposited tin gate strip, and the lead film is then patterned to form a carrier conductor in which the tin gate strip is serially connected. A control conductor is also patterned from the lead film in a position over, but insulated from, the tin gate strip to complete the cryotron.

Another method of forming such a "gated" circuit is described in U.S. Pat. 3,395,040. In the latter application, a process for manufacturing cryogenic circuits by the electroless substitution of tin for lead is described. In accordance with that process, very thin lead films are deposited and patterned to form the carrier conductor. Then a masking layer is formed over the lead strip which exposes the lead strip only in the area where the tin gate is desired. Then by an electroless process, the lead in the exposed area is substantially replaced by tin to provide the gate. A lead control conductor is subsequently formed over the tin gate to complete the cryotron structure.

Cryotron controlled cryogenic circuits have also been fabricated using various stencil-type masks and vapor deposition processes although these processes have not in general been proven to be practical in many applications.

All of the above processes utilize a multitude of steps, each of which is time consuming, and in general, the fewer steps required to fabricate a multi-layered film circuit, the less will be the expense of the finished product and the greater will be the probability that the finished product will function as desired.

SUMMARY

The invention provides an improvement in the process for manufacturing multi-layer film circuits on a substrate by successively forming electrically conductive and insulating films over the substrate while removing areas of the electrically conductive films to form the circuits and removing areas of the insulating films where electrical contact between areas adjacent electrically conductive films is necessary to complete the circuit. The improvement includes the steps of etching portions of a second conductive film which has been formed over a first conductive film with an etchant which will selectively remove the second conductive film but which will not remove the first conductive film. Such a process eliminates the need to form gates and the like by depositing a first film, such as tin, which is then coated with a photo-resist material. The photo-resist material was conventionally exposed and developed to open windows through the material to permit a metal, such as lead, deposited over the photo-resist material to make contact with the tin through the windows which have been opened in the photo-resist material. It also eliminates the need for eleatroless replacement of a metal, such as lead, by a second metal, such as tin. Inasmuch as the invention saves on the number of steps required to form a "gated" circuit or the like, it both provides a savings in cost of manufacture as well as increases the reliability of the products since there is less opportunity for "opens" or "shorts" to develop.

THE DRAWINGS

THE PREFERRED EMBODIMENTS

Figure 1:
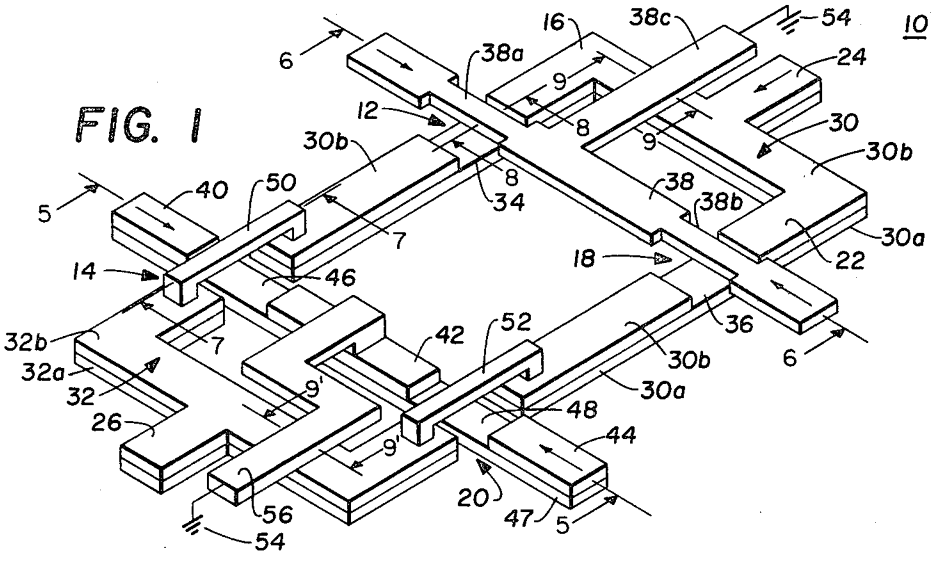
FIG. 1 is a somewhat schematic perspective view of a simple cryogenic flip-flop circuit with spacing between the circuit elements and the thickness of the elements exaggerated and the insulating layers substrate and ground plane removed. It serves to illustrate one embodiment of the present invention.

While the present invention has application to many multi-layer film circuits for use at both room and cryogenic temperatures, it can perhaps best be described in connection with a simple cryogenic flip-flop circuit, such as illustrated in FIG. 1. By way of background, cryogenic circuits may be considered as those circuits which are operated at such low temperatures that the metal conductors are superconductive, and exhibit no resistance until the current flowing therein exceeds a critical limit at which point the metal abruptly converts back to normal resistivity. Different metals have different critical current levels for a given superconductive temperature and magnetic field strength. One cryogenic circuit, characterized as a cryotron, utilizes this phenomenon to provide a means for switching a particular carrier conductor from superconductive to resistive. A cryotron is formed by positioning a control metal conductor having a relatively high critical current, at the operating temperature, in close proximity to a gate metal conductor having a relatively low critical current. A current in a control conductor at a level below the critical current for that conductor will nevertheless create a magnetic field adjacent the carrier conductor which will switch the carrier from superconductive to normal resistance.

With reference to FIG. 1, the flip-flop formed by process of this invention, and generally indicated by the reference numeral 10, makes use of the above cryotron principal. The circuit 10 is formed by a first loop segment 30 which includes the conductor portion 24, a second loop circuit 32 which includes the conductor 26, and the gate strips 34 and 36. A control conductor 38 has necked portions **38*a* and 38*b* which cross the gates 34 and 36 to form switching cryotrons 12 and 18, respectively. Integrally formed with and extending perpendicular proximate the center of conductor 38 is a conductor 38*c* suitably connected to ground 54. A current sensing circuit is formed by conductor strips 40, 42 and 44 which intercommunicate through gate strip portions 46 and 48. The gate strips 46 and 48 are disposed under bridges 50 and 52 which permit electrical communication between loop segments 30 and 32 to form sensing cryotrons 14 and 20. The center of conductor strip 42 is connected to ground 54 by bridge conductor 56. The insulation layers between the various strips and the ground plane have been omitted from FIG. 1 in order to simplify the drawing and more clearly illustrate the circuit components. However, it will be appreciated that the gates 34, 36, 46 and 48 are insulated from the necked portions 38*a*, 38*b*, and bridge conductors 50 and 52, respectively. Also, while several hundred metals and alloys are known to be superconductors at cryogenic temperatures, the metals from which the FIG. 1 embodiments are preferably made are lead (Pb) and tin (Sn). For example, a loop segment 30 is formed of a bottom layer 30*a* of tin with a layer 30*b* of lead formed directly over layer 30*a* and in intimate electrical contact therewith. Loop segment 32 is also formed of the bottom layer 32*a* of tin and a layer 32*b* of lead formed directly thereover and in intimate electrical contact therewith. Conductor strips 40, 42, and 44 are also formed of lead, underlying each of which is a continuous strip of tin 47. The conductor strip 38, including its portions 38*a–c*, as well as bridge conductors 50, 52, and 56** are also formed of lead.

In operation, current is directed through the conductor 24 into the parallel paths 16 and 22 of loop segment 30. Assuming that cryotrons 12 and 18 are both superconductive, the current divides between the parallel paths 16 and 22 in inverse proportion to the inductance of the respective paths. By passing sufficient current through the necked portions **38*a* to ground connection 54, the resistance of the superconductive tin gate 34 is restored and the cryotron 12 switched "off." All current will flow through superconducting path 22 including the tin gate 36 and the lead bridge portion 52. A sufficient current passing through the lead bridge portion 52 will switch the sensing cryotron 20 "off" such that the tin gate 48 will have normal resistance, which fact will be an indication that current is flowing in path 22**.

On the other hand, if current is introduced through the necked portion **38*b* to ground 54, the cryotron 18 will be switched "off" and the current will flow through parallel path 16. The current flow through the bridge portion 50 will switch the cryotron 14 "off" and serve to indicate that current is flowing through the parallel path 16**.

The process of the present invention may be more easily understood by reference to FIGS. 2–9. In general, the process comprises the steps of applying films of conductive and non-conductive material over substantially the entire face of the substrate. As illustrated in FIG. 1, various of the conductive films must be placed in electrical communication.

Figure 2:
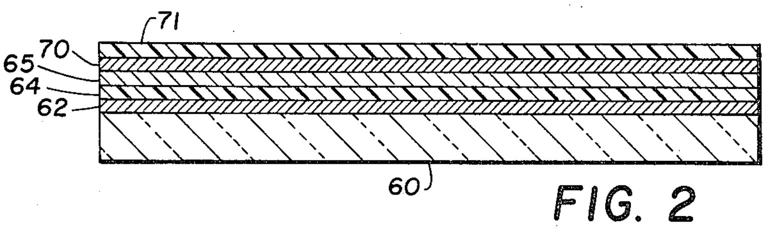
FIG. 2 is a cross sectional view through the substrate and the first four layers of material which would be deposited in forming the FIG. 1 device.
Figure 5:
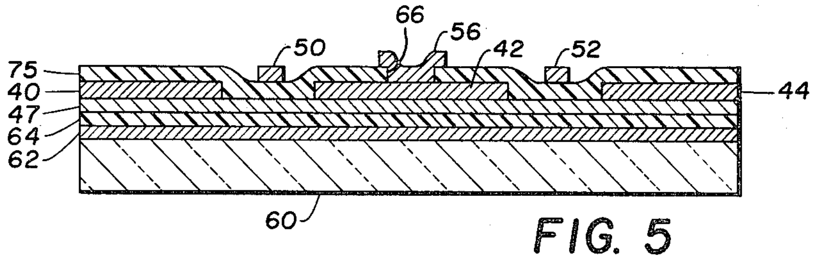
FIG. 5 is a sectional view taken along line 5—5 of FIG. 1, with the substrate, ground plane and insulation also being illustrated.
Figure 6:
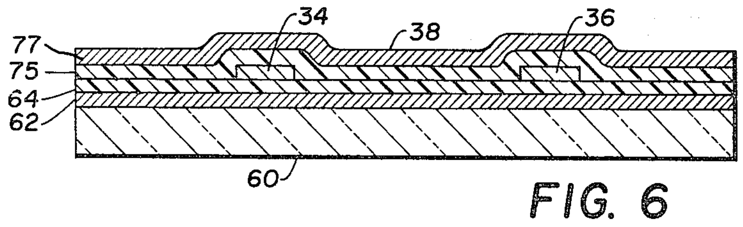
FIG. 6 is a sectional view taken along line 6—6 of FIG. 1, with the substrate, ground plane and insulation being included.

To be more specific, reference is made to FIG. 2 which represents a sectional view through the first few layers of the composite multi-layer circuit from which FIG. 1 may be formed, as will be more fully explained.

In the process of manufacturing the FIG. 1 circuit, and with reference to FIG. 2, a suitable substrate 60, preferably a soda lime glass square approximately 2″ x 2″, for example, is placed in a vacuum system which is then pumped down to approximately $10^{-5}$ mm. of Hg. However, it is to be understood that other substrates may be employed without departing from the scope of the invention. For example, a flexible substrate such as Mylar film can be used. The vacuum system is then backfilled to approximately $10^{-3}$ mm. of Hg with argon or oxygen and an AC glow discharge established in such a position that the substrate is located in the dark column. The glow discharge is carried out for five to fifteen minutes to improve adhesion of subsequent layers to the substrate 60. After the glow discharge treatment, the vacuum system is again pumped down to about $10^{-5}$ mm. of Hg and a film of lead 62 deposited over the entire face of the substrate 60. This can be accomplished using standard vapor deposition techniques wherein a lead source is heated in the vacuum chamber at a point spaced below the substrate and the vapor is directed upwardly through a chimney to impinge and condense upon the substrate surface. The lead film 62 may range from 1000 to 10,000 A. in thickness depending upon the design of the particular circuit being constructed.

Next, an insulating film 64 is applied over the surface of the lead film 62 by a suitable technique. The insulating film 64 is a photosensitive material such as that marketed by Kodak under the trade name KPR. KPR is a negative photo-resist material and when exposed to ultraviolet light is polymerized in the exposed areas. The insulating film 64 is completely exposed to polymerize the photoresist material over the entire surface of lead layer 62. The insulation layer 64 may be applied to substrate 60 and lead layer 62 by removing both from the vacuum system in which the lead is coated or formed on substrate 60 to a dry box in which the atmosphere is controlled to eliminate dust, moisture, oxidizing agents and other deleterious substances. The photo-resist material is then applied to the surface of lead 62 and exposed to ultraviolet light as described above.

After application of the insulating layer 64, substrate 60 and layers formed thereon is transferred from the dry box to the vacuum system which is then pumped down to about $10^{-5}$ mm. Hg. A layer of tin 65 is then deposited over the entire layer of insulation 64 which will ultimately form layer 30*a*, portions of which are gate strips 34 and 36, layer 32*a* and strip 47.

Next, a second lead film 70 is vapor deposited over the tin layer 65, in the manner described previously. Substrate 60 and the layers formed thereon is then removed to a dry box, such as described previously, and a coat of photo-resistant material 71, such as Azoplate AZ–17 sold by the Shipley Manufacturing Company of Wellesley, Mass., is then applied to the surface of the lead film over the entire surface. The AZ–17 is a positive photo-resist and when exposed to ultraviolet light is converted to a compound which can be removed by an AZ–17 developing fluid sold by the same manufacturer. The AZ–17 positive photo-resist material is believed to be described in U.S. Pats. 2,958,599; 2,975,053; 2,989,455; 2,994,608; 2,994,-609; and 2,995,442. After the AZ–17 is developed, only the unexposed areas remain. The unexposed areas can subsequently be removed by suitable stripper such as acetone. After the lead film 70 is coated over its entire surface with layer 71 of AZ–17 and is dried in a non-detrimental ambient, such as hydrogen or argon, it may be baked at a low temperature of about 95° C. to improve its adhesion to the lead film.

After the AZ–17 coat is cured, a photo-mask, having transparent portions in predetermined areas where the lead film 70 and tin film 65 immediately thereunder are to be removed and opaque portions where the films 70 and 65 are to be retained, is generally aligned over the substrate 60 and then moved in close proximity to the insulating layer 71 to reduce shadowing effects. The insulating or photo-resistant material 71 is exposed to an ultraviolet light source for a suitable period of time. The substrate is then immersed in the AZ–17 developer to remove the exposed areas of the AZ–17 coat and then dipped in de-ionized water to kill the action of the developing fluid.

Next, substrates 60 and the material arraying thereon is immersed in an etchant which will not attack the protective coat of AZ–17 but will attack the exposed areas of the lead film 70 and the layer of tin 65 directly beneath layer 70. A 10–50% solution, by volume, of $HNO_3$ serves as a very good etchant for this purpose. After the necessary time, the substrate is again quenched in de-ionized water to kill the etchant and is dried in a non-detrimental ambient so as not to oxidize the surface of the lead and tin exposed by the etching process. The remaining AZ–17 coat is then removed by immersing the substrate in a suitable stripping fluid such as acetone, and dried with an inert gas. Again, it is desirable to maintain the exposed areas of the lead and tin film in a non-detrimental atmosphere to prevent oxidation or other contamination of the surface. At this point it is also well to note that the first lead film 62 serves as a ground plane (to serve as ground 54 in FIG. 1) reference for the flip-flop circuit 10 and normally will extend under all component parts and conductors of the flip-floo circuit 10. The ground plane 62 will usually have suitable exposed tab portions for connections to conductors such as conductors 38*c* and 56 of FIG. 1. In forming of a flip-flop circuit 10, the above steps will, after etching of the tin layer 65 and lead layer 70, produce a pattern, such as illustrated in FIG. 3, in which the substrate 60, ground plane 62, and insulation 64 are omitted.

Next, a photo-sensitive material, such as that marketed by Kodak under the trade name KPR, is applied to the surface of the films remaining on substrate 60. KPR is a negative photo-resist material and when exposed to ultraviolet light is polymerized in exposed areas. The unexposed areas of the KPR film can then be removed by simple developing process using KPR developing fluid sold for this purpose by Kodak. It is believed that the KPR type photo-resist material is disclosed in its various aspects in U.S. Pats. 2,690,966; 2,732,301; and 2,861,057.

Figure 3:
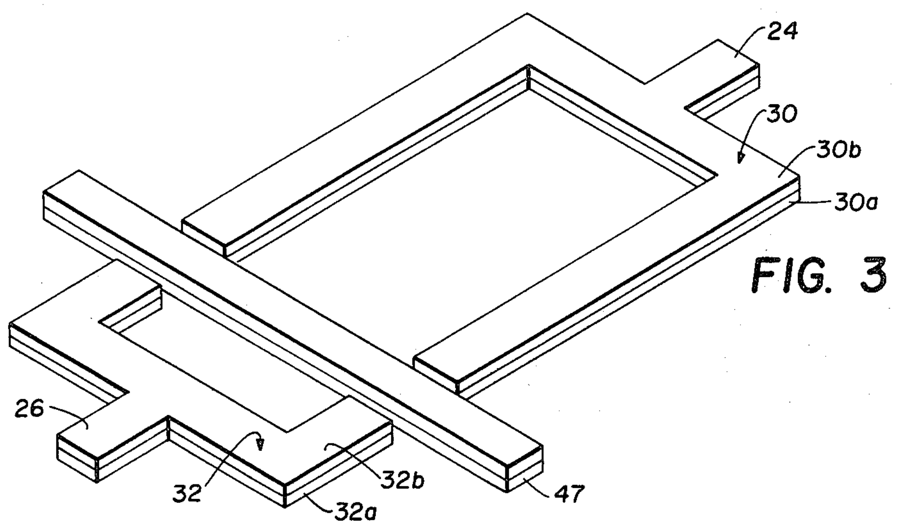
FIG. 3 is a perspective view of the FIG. 1 device at one stage during its manufacture, with the insulating layers, substrate and ground plane removed.
Figure 4:
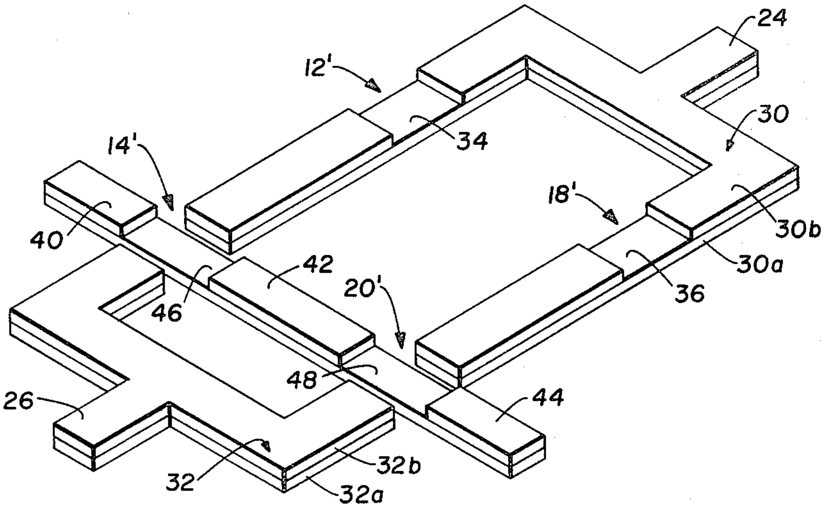
FIG. 4 is a perspective view of the FIG. 1 device at a further stage of manufacture, with the insulating layers, substrate and ground plane removed.

After the KPR coat has been dried, a second opaque and transparent photo mask is precisely indexed with the pattern previously etched from the lead film 70 and tin film 64, as illustrated in FIG. 3, and pressed against the substrate. The KPR film is exposed to ultraviolet light in all areas except where sensing cryotrons 14 and 20 and switching cryotrons 12 and 18 are to be formed generally indicated by the reference numerals 14′, 20′, 12′ and 18′, respectively, in FIG. 4. Then, when the substrate 60 and films thereon are immersed in the developer for the KPR material, the unexposed portions are removed by the developing fluid to leave "windows" over areas 14′, 20′, 12′ and 18′ in FIG. 4.

Next, substrate 60 and films thereon is immersed in a selective etchant such as a fluid having the following composition.

| Constituent: | Percent by volume |
|---|---|
| Water | 88.5 |
| Acetic acid | 10.0 |
| Hydrogen peroxide | 1.5 |

A selective etchant such as that detailed above will remove the lead exposed through the windows of the KPR coat, but will not affect the tin film 65. After immersion of the substrate 60 and films in the selective etchant for several seconds, an etchant such as that detailed above being effective to etch one micron of lead in less than 3 seconds, the substrate 60 and layers formed thereon are immersed in de-ionized water to kill the action of the etchant. The remaining portion of the KPR coat may then be removed in a suitable solvent.

Next, an insulating film 75 is applied over the surface of the remaining lead film 70 and that portion of the tin film 65 which has been exposed. The insulating film 75 is a photo-sensitive material such as that marketed by Kodak under the trademark KPR, described before. As illustrated in FIGS. 5–9, film 75 will conform to the surface of the underlying films.

Figure 7:
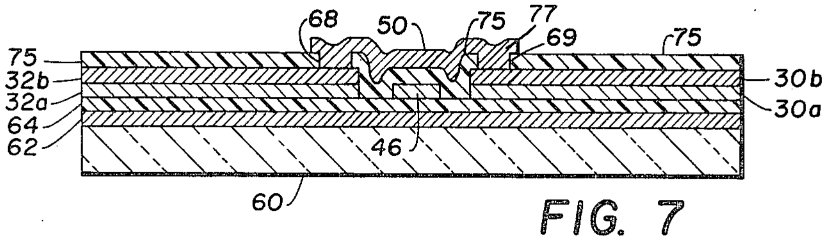
FIG. 7 is a sectional view taken along line 7—7 of FIG. 1, with the substrate, ground plane and insulation being included.
Figure 8:
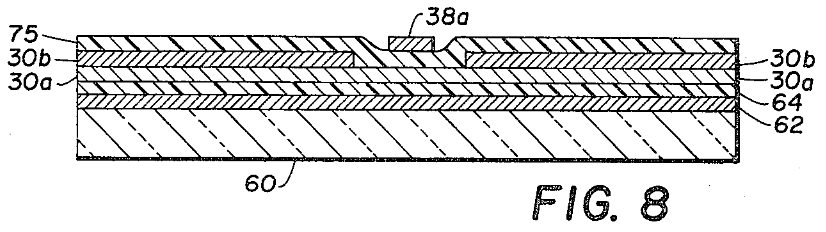
FIG. 8 is a sectional view taken along line 8—8 of FIG. 1, with the substrate, ground plane and insulation being included.
Figure 9:
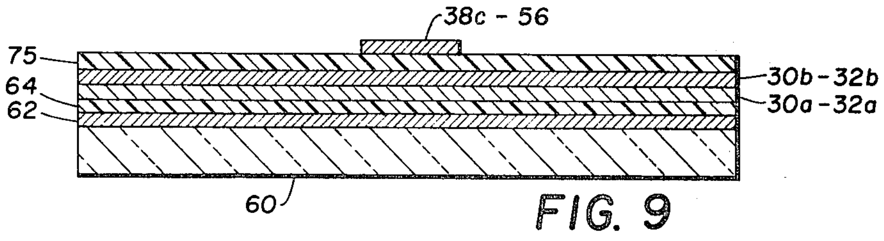
FIG. 9 is a sectional view illustrating the sections taken along line 9—9 and line 9′—9′ of FIG. 1, with the substrate, ground plane and insulation being included.
Figure 10:
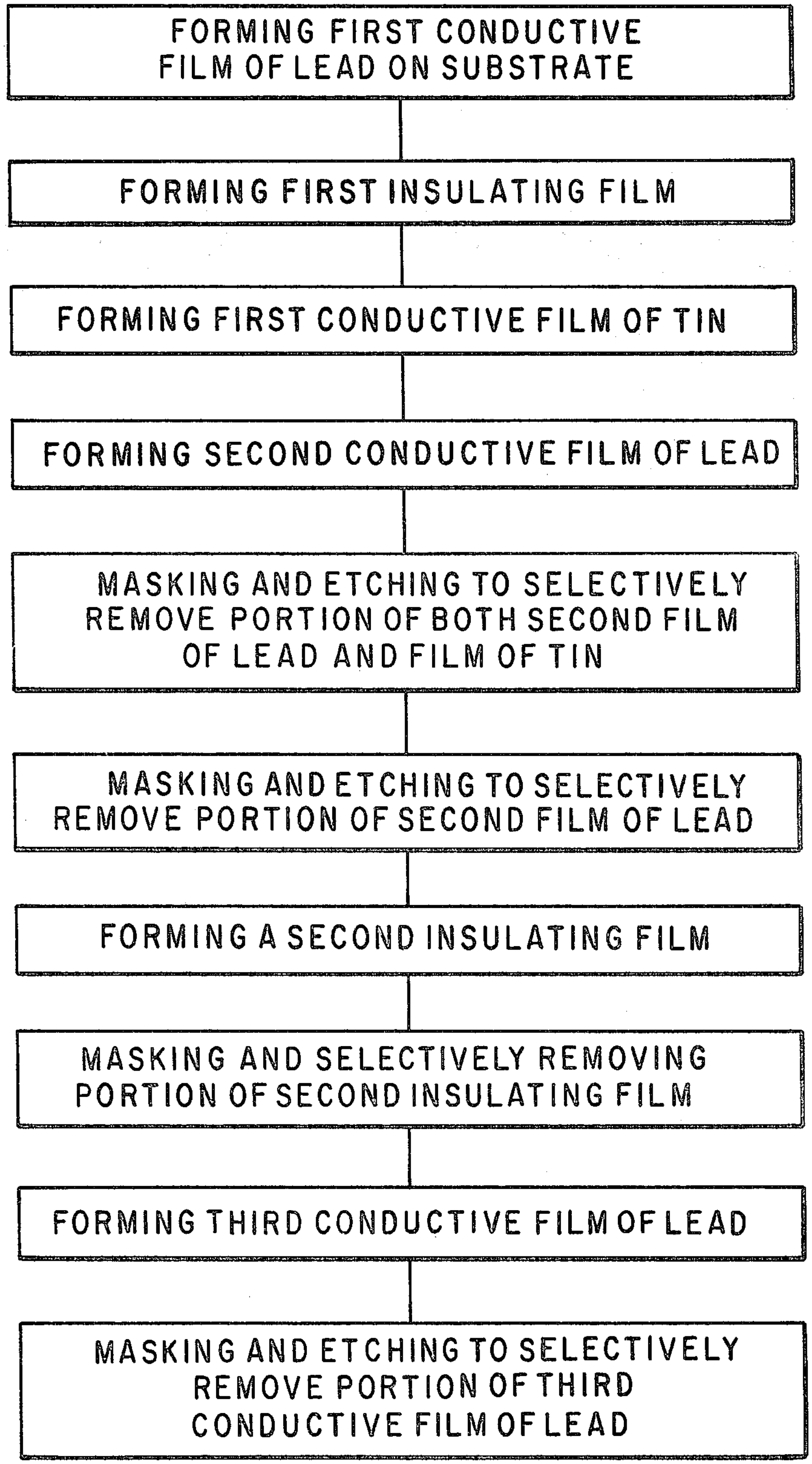
FIG. 10 is a flow diagram showing basic process steps of the invention.

After the KPR coat has been dried, the second opaque and transparent photo mask is positioned over the layers on substrate 60 and the KPR film is exposed to ultraviolet light in all areas except where electrical contact is desired between circuitry to be subsequently deposited, namely, where bridge conductors 50, 52 and 56 are to contact layer 70. Then, when the substrate 60 and films thereon are immersed in the developer for the KPR coat, the unexposed portions are removed by the developing fluid to leave windows in the KPR coat so that the next metal film will be deposited through the windows. Specifically, and with reference to FIG. 5, a window 66 will be opened through KPR coat 75 for bridge conductor 56. With reference to FIG. 7, windows 68 and 69 will be opened for the subsequently deposited bridge conductor 50, and identical windows will be opened for bridge conductor 52.

Substrate 60, and the films deposited thereon, are then placed in a vacuum system once again. Care should be taken to minimize oxidation of the surface of the lead film exposed through the windows 66, 68 and 69. The vacuum system is then pumped down to about $10^{-5}$ mm. of mercury and the exposed surface of the lead cleaned by glow discharge as previously described. Then a third layer of lead 77 is deposited over insulating layer 75 passing through the windows formed therein and forming a contact with the lead exposed through the windows.

The substrate 60 is then removed from the vacuum system and a coat of AZ–17 photo-resist material applied, exposed and developed, as described above, to expose all of the areas of lead deposited on insulation 75 except those areas over bridge conductors 48, 50 and 52 and conductor strip 38. Next, the substrate 60 and films deposited thereon is deposited in an etchant such as nitric acid to remove the exposed portions of lead, after which substrate 60 is dipped in de-ionized water to stop the action of the etchant and the remaining portion of the AZ–17 coat is removed with acetone to produce a FIG. 1 circuit, which is illustrated in detail in FIGS. 5–9.

It will be observed that after exposure of the last coat of AZ–17, the lead remaining after etching slightly overlaps windows 66, 68 and 69 to prevent the subsequently applied etching solution from entering the windows 66, 68 and 69 in the last etching step.

While the circuitry illustrated in FIG. 1, and FIGS. 5–9 may be covered with an insulating layer, KPR, for example, it is not necessary, and such an insulation has not been illustrated.

An important aspect of this invention is the ease and speed with which its process can be carried out. It should be observed from FIG. 2, for example, that the first four films may be formed on the substrate 60 before an etching step is necessary. Because the lead can now be etched in the presence of an underlying layer of tin, it is not necessary to follow the prior practice of covering the tin with a photo-resist material, which is exposed and developed. After development, the tin was etched to leave gate strips, and the strips covered with a second layer of photo-resist material which was then exposed to open windows therethrough to the tin layer before deposition of lead over the insulation.

Inasmuch as fewer steps are required to produce a circuit, such as illustrated in FIG. 1, and fewer etching steps are required, the expense of producing such circuits is reduced and the greater will be the probability that the circuits thus produced will operate effectively, since the more steps which must be followed in manufacture of such a device, the higher will be the probability that an "open" or "short" will develop due to the extremely thin nature of the films.

It should also be remarked, that the steps described in connection with the present invention may even be reduced as follows. After production of the pattern illustrated in FIG. 3, the AZ–17 positive photo-resist material overlying the pattern, which has previously been exposed to permit etching of the lead and tin layers 65 and 70, could have been further exposed over the areas 14′, 20′, 12′ and 18′ followed by selective etching with the water, acetic acid and hydrogen peroxide solution described above. However, since the effectiveness of some positive photo-resist materials will be affected by the nitric acid etchant used in removing the lead and tin layers to form the pattern of FIG. 3, it is preferred that the AZ–17 coat overlying that pattern be removed and a new coat of photo-resist material applied for exposing the areas 14′, 20′, 12′ and 18′.

Although the present invention has been described in connection with the use of photographically sensitive polymers as insulating films, it is to be understood that any suitable insulating material may be used which can be selectively etched in the desired patterns and will resist the etchant for the metals. Also, the AZ–17 may be used for this purpose because it can be cured by heat treatment so as to resist the stripper fluid and metal etchants.

However, the polymer resulting from the exposure and development of KPR has been found to be particularly well suited for cryogenic circuits because it does not collapse or shatter at the low temperatures and does not deteriorate in repeated cycling between room and cryogenic temperatures. Lead and tin have also been found to be particularly well suited for the present process of manufacturing multi-layer film circuits involving cryotrons, for example. However, the applicability of the process is not limited to lead and tin, but may be applied with respect to other appropriately chosen metals since the etchant solution described above may be used to etch numerous metals in the presence of tin, without affecting the tin. The selective etchant solution of water acetic acid and hydrogen peroxide has been diluted with water to reduce the hydrogen peroxide concentration to 0.023 percent by volume without apparently altering its effectiveness, and the concentrations given are not therefore critical ones. There must be provided, however, at least a trace amount of the hydrogen peroxide. The selective etch solution will not attack the photo-resist material described, and is therefore quite effective for its intended purpose.

The order in which the conductive layers are deposited may be varied as desired to obtain substantially any circuit configuration.

While the described embodiment of the invention involves a cryogenic flip-flop circuit, the invention obviously is not limited to such a circuit and may be equally as well applied to other multi-layer film circuits used at both cryogenic, room and elevated temperatures. While rather specific terms have been used in describing the illustrated embodiment, they are not intended, nor should they be construed as a limitation upon the invention as defined by the claims.

We claim:

1. In the process for manufacturing thin multi-layer cryogenic flip-flop circuits on a substrate by successively forming electrically conductive and insulating films over the substrate while removing areas of the electrically conductive films to form the circuit and removing areas of the insulating films where electrical contact between areas of adjacent electrically conductive films is necessary to complete the circuit, the improvement comprising the steps of:

(a) forming a layer of a conductive film of lead on said substrate thereby forming a ground reference plane;
(b) forming a first insulating film over said film of lead;
(c) forming a layer of a conductive film of tin over said insulating film;
(d) forming a second layer of a conductive film of lead directly over and in contact with said conductive film of tin;
(e) masking and etching to remove selected portions of both said second film of lead and said film of tin immediately thereunder;
(f) masking and etching selected portions of the remainder of said second film of lead with an etchant comprised essentially of water, acetic acid and hydrogen peroxide which will selectively remove said second film of lead but which will not remove said film of tin, thereby exposing selected areas of said film of tin;
(g) forming a second insulating film over said second conductive film of lead and said exposed areas of the film of tin;
(h) masking and etching selected portions of said second insulating film thereby exposing selected areas of said second conductive film of lead;
(i) forming a third conductive film of lead over said second insulating film whereby said third conductive film of lead contacts said exposed second conductive film of lead; and
(j) masking and etching to remove selected portions of said third conductive film of lead thereby forming lead control conductors and ground leads.

2. The process of claim 1, including the steps of:

(a) forming a layer of a positive photoresist material over said second conductive film of lead after forming said second conductive film of lead over said conductive film of tin;
(b) exposing said positive photoresist material over a predetermined area;
(c) developing said photoresist material to remove the exposed portion thereof;
(d) etching said films of lead and tin, removing portions of both to form a desired pattern;
(e) exposing a selected portion of the remaining positive photoresist material; and
(f) developing the photoresist material to remove the exposed portions thereof before etching portions of said second conductive film of lead with an etchant which will remove said second conductive film of lead but which will not remove said conductive film of tin.

3. The method of claim 1, including the steps of:
(a) forming a layer of a photoresist material over said second conductive film of lead after forming said second film of lead over said film of tin;
(b) exposing said photoresist material over a predetermined area;
(c) developing said photoresist material to remove the exposed or unexposed portions thereof;
(d) etching said films of lead and tin to remove both for forming a desired pattern;
(e) removing the remainder of the photoresist material;
(f) forming a layer of photosensitive material over said desired pattern;
(g) exposing said photosensitive material over a predetermined area; and
(h) developing said photosensitive material to remove the exposed or unexposed portions thereof to expose a portion of said pattern before etching said conductive film of lead with an etchant which will selectively remove said film of lead but which will not remove said layer of tin.

4. The method of claim 1, including the steps of:
(a) forming a layer of a photosensitive material over said second conductive film of lead and said exposed areas of the conductive layer of tin;
(b) exposing said photosensitive material over a predetermined area;

(c) developing said photosensitive area to remove the exposed or unexposed portion thereof thereby exposing selected portions of said second conductive film of lead;
(d) forming a third conductive film of lead over said layer of photosensitive material and said exposed portions of said second conductive film of lead;
(e) forming a layer of photoresist material over said third conductive film of lead;
(f) exposing said photoresist material over a predetermined area;
(g) developing said photoresist material to thereby expose selected areas of said third film of lead; and
(h) etching said exposed areas thereby forming lead control conductors and ground leads.

5. The method of claim 1, wherein said hydrogen peroxide is present in at least a trace amount.

References Cited

UNITED STATES PATENTS

| | | | |
|---|---|---|---|
| 3,366,519 | 1/1968 | Pritchard et al. | 156—3 |
| 2,584,317 | 2/1952 | Aller | 156—13 XR |
| 2,731,333 | 1/1956 | Ko et al. | 156—3 |

JACOB H. STEINBERG, Primary Examiner

U.S. Cl. X.R.

156—11, 18